United States Patent
De Boer et al.

(10) Patent No.: US 9,972,755 B2
(45) Date of Patent: May 15, 2018

(54) SIDEWARD EMITTING LUMINESCENT STRUCTURES AND ILLUMINATION DEVICE COMPRISING SUCH LUMINESCENT STRUCTURES

(71) Applicant: PHILIPS LIGHTING HOLDING B.V., Eindhoven (NL)

(72) Inventors: Dirk Kornelis Gerhardus De Boer, Eindhoven (NL); Marcus Antonius Verschuuren, Eindhoven (NL); Jamie Gómez Rivas, Eindhoven (NL); Rahimzadeh Kalaleh Rodriguez, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days. days.

(21) Appl. No.: 15/517,186

(22) PCT Filed: Sep. 30, 2015

(86) PCT No.: PCT/EP2015/072501
§ 371 (c)(1),
(2) Date: Apr. 6, 2017

(87) PCT Pub. No.: WO2016/058828
PCT Pub. Date: Apr. 21, 2016

(65) Prior Publication Data
US 2017/0309797 A1 Oct. 26, 2017

(30) Foreign Application Priority Data

Oct. 14, 2014 (EP) ..................................... 14188783

(51) Int. Cl.
*H01L 33/50* (2010.01)
*H01L 33/58* (2010.01)
(Continued)

(52) U.S. Cl.
CPC .............. *H01L 33/507* (2013.01); *F21K 9/61* (2016.08); *F21K 9/64* (2016.08); *F21K 9/68* (2016.08);
(Continued)

(58) Field of Classification Search
CPC ......... H01L 33/50–33/508; F21K 9/64; G02B 5/008
See application file for complete search history.

(56) References Cited

U.S. PATENT DOCUMENTS

2010/0046572 A1 2/2010 De Rossi et al.
2010/0126566 A1* 5/2010 Ji ........................... G02B 5/008
136/252

(Continued)

OTHER PUBLICATIONS

Gabriel Lozano et al, "Plasmonics for solid-state lighting: enhanced excitation and directional emission of highly efficient light sources", Light: Science & Applications, vol. 2, No. 5, May 1, 2013, p. e66, XP055177586, DOI: 10.1038/ISA.2013.22.

*Primary Examiner* — Mariceli Santiago

(57) ABSTRACT

Illumination structure (100) and illumination devices comprising such illumination structure are described. The illumination structure comprises a wavelength conversion layer (102) configured for receiving light of at least a first wavelength (108) and converting said received light into light of at least a second wavelength; and, an array of nanoparticles (110) arranged in a plane in close proximity to said wavelength conversion layer, at least part of said array forming a lattice characterized by at least one lattice period, wherein said lattice period is selected such that in operation: localized resonances of said nanoparticles are diffractively coupled into collective resonant modes at said second wavelength in said wavelength conversion layer (102); and, a sideward emitting radiation pattern is generated by said illumination structure that comprises field intensities in one (Continued)

or more directions of large inclination angle $\Theta_i$ (114) with respect to said array plane that are larger than field intensities in one or more directions of small inclination angle.

15 Claims, 10 Drawing Sheets

(51) Int. Cl.
  *F21K 9/64* (2016.01)
  *F21K 9/61* (2016.01)
  *F21K 9/68* (2016.01)
  *G02B 5/00* (2006.01)

(52) U.S. Cl.
  CPC ............ *G02B 5/008* (2013.01); *H01L 33/502* (2013.01); *H01L 33/505* (2013.01); *H01L 2933/0083* (2013.01)

(56) References Cited

U.S. PATENT DOCUMENTS

| | | |
|---|---|---|
| 2011/0089815 A1 | 4/2011 | Yeh et al. |
| 2012/0018755 A1 | 1/2012 | Speck et al. |
| 2012/0026720 A1* | 2/2012 | Cho .................... F21K 9/27 362/84 |
| 2012/0314189 A1* | 12/2012 | Natsumeda ............ H01L 33/58 353/20 |
| 2013/0027675 A1* | 1/2013 | Natsumeda ............ G02B 5/008 353/88 |
| 2013/0286633 A1* | 10/2013 | Rodriguez ............ H01L 33/50 362/84 |
| 2016/0161644 A1* | 6/2016 | Verschuuren ........ H01L 33/508 250/396 R |
| 2016/0190403 A1* | 6/2016 | Verschuuren ........ H01L 33/504 257/98 |
| 2017/0082785 A1* | 3/2017 | Verschuuren ........ H01L 33/507 |

\* cited by examiner

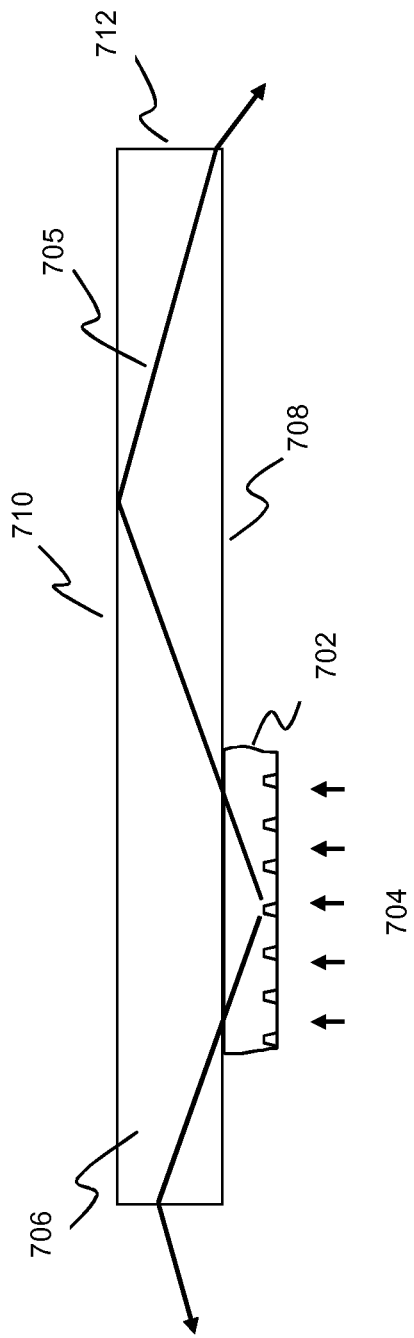
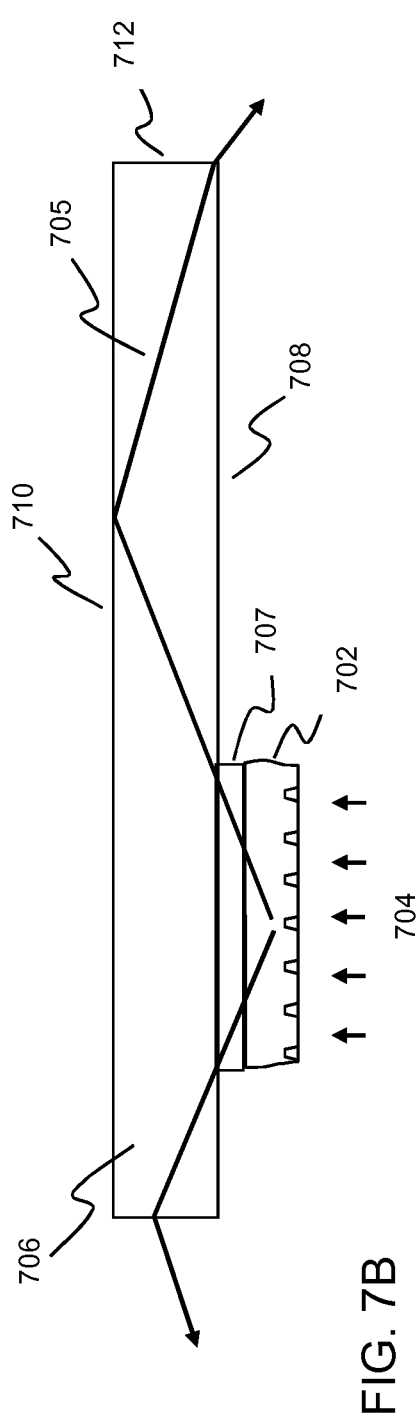
FIG. 7A
FIG. 7B

SIDEWARD EMITTING LUMINESCENT STRUCTURES AND ILLUMINATION DEVICE COMPRISING SUCH LUMINESCENT STRUCTURES

CROSS-REFERENCE TO PRIOR APPLICATIONS

This application is the U.S. National Phase application under 35 U.S.C. § 371 of International Application No. PCT/EP2015/072501, filed on Sep. 30, 2015, which claims the benefit of European Patent Application No. 14188783.6, filed on Oct. 14, 2014. These applications are hereby incorporated by reference herein.

FIELD OF THE INVENTION

The invention relates to sideward emitting luminescent structures, and, in particular, though not exclusively, to sideward emitting luminescent structures and illumination devices comprising such sideward emitting luminescent structures.

BACKGROUND OF THE INVENTION

Current state-of-the-art solid-state lighting devices use wavelength conversion materials, e.g. phosphor, in order to convert a fraction of the light of e.g. a blue LED into light of a longer wavelength e.g. red light. The mixing of the light of the blue LED with the phosphor-emitted light results in a spectrum that is perceived by humans as white light.

Although the conversion process is very efficient, phosphor-converted solid-state light sources have a non-directional (Lambertian) light distribution and hence a relatively large étendue. Due to the non-directional light distribution of these light sources it is very difficult to achieve efficient light coupling into light guides thereby making such light sources not or at least less suitable for light guide applications. Moreover, the non-directional light distribution often requires complex secondary optics in order to achieve the desired collimated light beam of a homogenously distributed intensity that is required in e.g. projector lights and headlights spot lights. Besides the complexity, secondary optics are often bulky and inefficient thereby leading to an overall loss of efficiency of the optical system. For example, a relatively complex combination of reflective and refractive optics is needed in order to shape the non-directional light of the phosphor-converted light source into a collimated beam of a homogenously distributed intensity.

Lozano et al., describe in their article "Plasmonics for solid-state lighting: enhanced excitation and directional emission of highly efficient light sources", Light: Science & Applications (2013)2, e66, the use of a metal nanoparticle array that is in contact with a luminescent wavelength conversion layer in order to achieve enhanced directional emission of light in the forward direction. Such array allows conversion of non-directional light of a solid-state luminescent light source into light with a preference in the forward direction. Although the light originating from such array is directional in the forward direction, it still needs relatively bulky refractive secondary optics in order to achieve a collimated beam of a homogenously distributed intensity. Moreover directional light in the forward direction is not or less suitable for light injection in planar light guides.

Hence, in view of the above, it is desired to provide simple luminescent structures for solid-state light sources that enable efficient directional emission of light in the sideward direction. In particular, it is desired to provide sideward emitting luminescent structures for use in solid-state light sources that can be easily coupled to planar light guides and that can be used with simple reflective light concentrator, e.g. a compound parabolic concentrator (CPC), in order to form high brightness collimated light beams.

SUMMARY OF THE INVENTION

It is an objective of the invention to reduce or eliminate at least one of the drawbacks known in the prior art. In an aspect, the invention relates to an illumination structure comprising: a wavelength conversion layer configured for receiving light of at least a first wavelength and converting said received light into light of at least a second wavelength; an array of nanoparticles arranged in a plane in contact with or in close proximity to said wavelength conversion layer, at least part of said array forming a lattice characterized by at least one lattice period, wherein said lattice period is selected such that in operation: resonances of at least part of said nanoparticles are diffractively coupled into one or more collective resonant modes at said second wavelength in said wavelength conversion layer; and, a sideward emitting radiation pattern is generated by said illumination structure, wherein said radiation pattern comprises field intensities in one or more directions of large inclination angle $\theta_i$ with respect to said array plane that are larger than field intensities in one or more directions of small inclination angle.

Hence, it has been surprisingly found that a nanoparticle array in close proximity to said wavelength conversion layer can be configured such that in operation localized nanoparticles resonances can be diffractively coupled thereby forming one or more collective resonant modes at said second wavelength in said wavelength conversion layer wherein the one or more collective resonance modes provide a sideward emitting radiation pattern, comprising field intensities in one or more directions of large inclination angle $\theta_i$ (with respect to the plane of the nanoparticle array) that are larger than field intensities in one or more directions of small inclination angle. Here, the term sideward emitting luminescent structures can include luminescent structures that have a so-called batwing radiation pattern and/or a side-emitting radiation pattern. Such sideward emitting structures may be used in many applications including light injection into flat light guides and efficient formation of bright collimated light beams.

Here, the terms large and small inclination angles can be defined with reference to the critical angle of the dielectric interface of the wavelength conversion layer with its surroundings. Hence, large inclination angles are angles that are substantially larger than the critical angle and small inclination angles are angles that are substantially smaller than the critical angle.

In an embodiment said one or more collective resonant modes may comprise one or more surface-lattice resonant modes associated with said nanoparticle array, said at least one lattice period being selected such that at least one of said one or more surface lattice resonant modes is resonant with said light of said second wavelength. Hence, the collective resonant modes of the nanoparticle array (surface-lattice resonant modes) resonantly couple with the light that is emitted by the wavelength conversion layer. These resonant modes can be controlled by the lattice period of the particle lattice formed by the nanoparticle array.

In an embodiment, said one or more collective resonant modes comprise one or more waveguide modes associated with said wavelength conversion layer, said at least one lattice period being selected such that at least one of said one or more waveguide modes is resonant with said light of said second wavelength. In this embodiment, the individual nanoparticles may collectively and resonantly couple to one or more waveguide modes of the wavelength conversion layer.

In an embodiment, at least part of said wavelength conversion layer may be in contact with one or more low-index layers for providing strong waveguide modes in said wavelength conversion layer, the refractive index of said low-index layer being smaller than the refractive index of said wavelength conversion layer. Hence, the wavelength conversion layer may support strong waveguide modes by choosing a material with an appropriate refractive index, e.g. a refractive index between air and the refractive index of the wavelength conversion layer.

In one embodiment the thickness of said wavelength conversion layer may be selected such that said field intensities in one or more directions of large inclination angle $\theta_i$ are enhanced by said at least one of said one or more waveguide modes that is resonant with said light of said second wavelength. The emission of light in the direction of large inclination angle can be enhanced by resonant coupling to one or more waveguide modes.

In an embodiment, the thickness of the wavelength conversion layer may be selected between 400 and 4000 nm. In another embodiment, the wavelength conversion layer may be selected between 1300 and 2000 nm. The enhancement by resonant coupling to waveguide modes in particular strong when the thickness is selected between selected 300 and 4000 nm. Within this thickness range the confinement factor in the waveguide defined by the wavelength conversion layer is large.

In one embodiment said least one lattice period may be selected such that if said wavelength conversion layer is in contact with a light guide at least part of said one or more directions of large inclination angle $\theta_i$ are larger than the critical angle for total reflection in said light guide. Hence, the lattice period of the nanoparticle array may be selected such that the light will be efficiently injected into a light guide.

In an embodiment said least one lattice period p may be selected such that:

$$\lambda/(n_1+n_2)<\Lambda<\lambda/(1+n_2)$$

wherein the lattice distance $\Lambda(\varphi)$ is defined as the lattice vector at azimuthal angle $\varphi$ (i.e. the azimuthal projection of the lattice vector with length p), $n_1$ is the refractive index of said wavelength conversion layer, $n_2$ is the refractive index of said light guide layer and $\lambda$ is the wavelength of the light of said second wavelength. This condition may be used in order to select a lattice spacing for a predetermined lattice that ensures that emission of the light will be larger than the critical angle for all or at least a large part of azimuthal angles.

In an embodiment, said lattice may be arranged to have one or more symmetries for providing a substantially symmetric sideward emitting radiation pattern. In an embodiment said lattice may have a rotational, reflectional, translational, helical, scale and/or fractal symmetry. In another embodiment, said lattice may be formed by aperiodic tiling, preferably said aperiodic tiling forming a Penrose lattice. In yet another embodiment, said lattice may have a bulls-eye pattern or a sunflower pattern.

In an embodiment at least a part of said nanoparticles may be metallic nanoparticles. In an embodiment, metallic nanoparticles may include nanoparticles comprising Ag, Al, Ga, Cu, Au or alloys thereof. In another embodiment, the nanoparticles may be dielectric nanoparticles, preferably low-index dielectric nanoparticles. In an embodiment, dielectric nanoparticles may include nanoparticles comprising a metal oxide, a semiconductor or a polymer.

In an embodiment, at least part of said nanoparticles may have a shape of a (truncated) pyramid or a (truncated) cone, preferably said truncated pyramid having a bottom side length in the range of 100 to 300 nm and a top side length in the range of 30 nm to 250 nm and said truncated cone having a bottom diameter in the range 100 to 300 nm, a top diameter in the range of 30 to 250 nm and a height in the range of 30 to 400 nm. Hence, the shape of the particles may be optimized in order to provide strong local resonances that can be collectively coupled via diffraction.

In a further aspect, the invention may relate to an illumination device comprising at least one light source configured to emit light of at least a first wavelength; and, one or more illumination structures as described above.

In an embodiment, the illumination device may further comprise at least one light guide optically coupled or in contact to said illumination structure such that at least part of the light with large inclination angle is injected in said light guide. Such light injection is particular advantageous in thin-layer light emitting devices such as light tiles or flexible light-emitting foils. As the injected light should stay inside the light guide medium, the nanoparticle array is configured such that a substantial part of the emitted light has an inclination angle equal to or larger than the critical angle so that the light can be internally transported via total internal reflection to an emitting face of the light guide.

In an embodiment, an optical coupling layer is arranged between said light guide and said illumination structure wherein the refractive index of said coupling layer is selected between the refractive index of said light guide and the refractive index of air. The (low-index) optical coupling layer may provide strong wave-guide modes, which would disappear when the emissive layer would be brought in contact with a matching index of e.g. a glue or glass of the light guide. By selecting a material with a refractive index between air and the refractive index of the light guide, both waveguide modes and coupling under the critical angle are possible.

In an embodiment, at least part of the light guide may be configured as a transparent sheet comprising a top surface, a bottom surface and one or more side faces, wherein said top and/or bottom surface comprises one or more light extraction structures for coupling light out of said light guide. Alternatively and/or in addition, at least a part of said one of said side faces of the light guide may be coupled to a light extraction structure that is configured as an angle-to-area converter of a transparent material wherein the angle-to-area conversion is achieved by total internal reflection in said light extraction structure.

In an embodiment, the illumination device may further comprise: one or more reflective members for converting at least part of the sideward emitting light (that is transported without substantial loss to one of the sides of the light guide by total internal reflection) of the illumination structure into a substantially collimated light beam. In one embodiment, said one or more reflective members may form an angle-to-area converter. In another embodiment, said one or more reflective members forming a compound parabolic concentrator or an equivalent thereof.

Hence, a reflective angle-to-area converter such as a compound parabolic concentrator (CPC) may be used for converting at least part of the sideward emitting light of the illumination structure into a high-brightness collimated light beam. In contrast to conventional solid-state luminescent light sources that require lossy and bulky secondary optics comprising a combination of reflective and diffractive optical elements, the luminescent sideward emitting structure enables the realization of sideward emitting so lid-state light sources that only need reflective elements for the realization of directional light beams. This is particular advantageous in case of high-brightness directional light sources (e.g. for projection), automotive headlights spot lights, etc.

The invention will be further illustrated with reference to the attached drawings, which schematically will show embodiments according to the invention. It will be understood that the invention is not in any way restricted to these specific embodiments.

BRIEF DESCRIPTION OF THE DRAWINGS

FIG. 7A and 7B depict illumination devices according to various embodiments of the invention.

DETAILED DESCRIPTION

Figure 1:
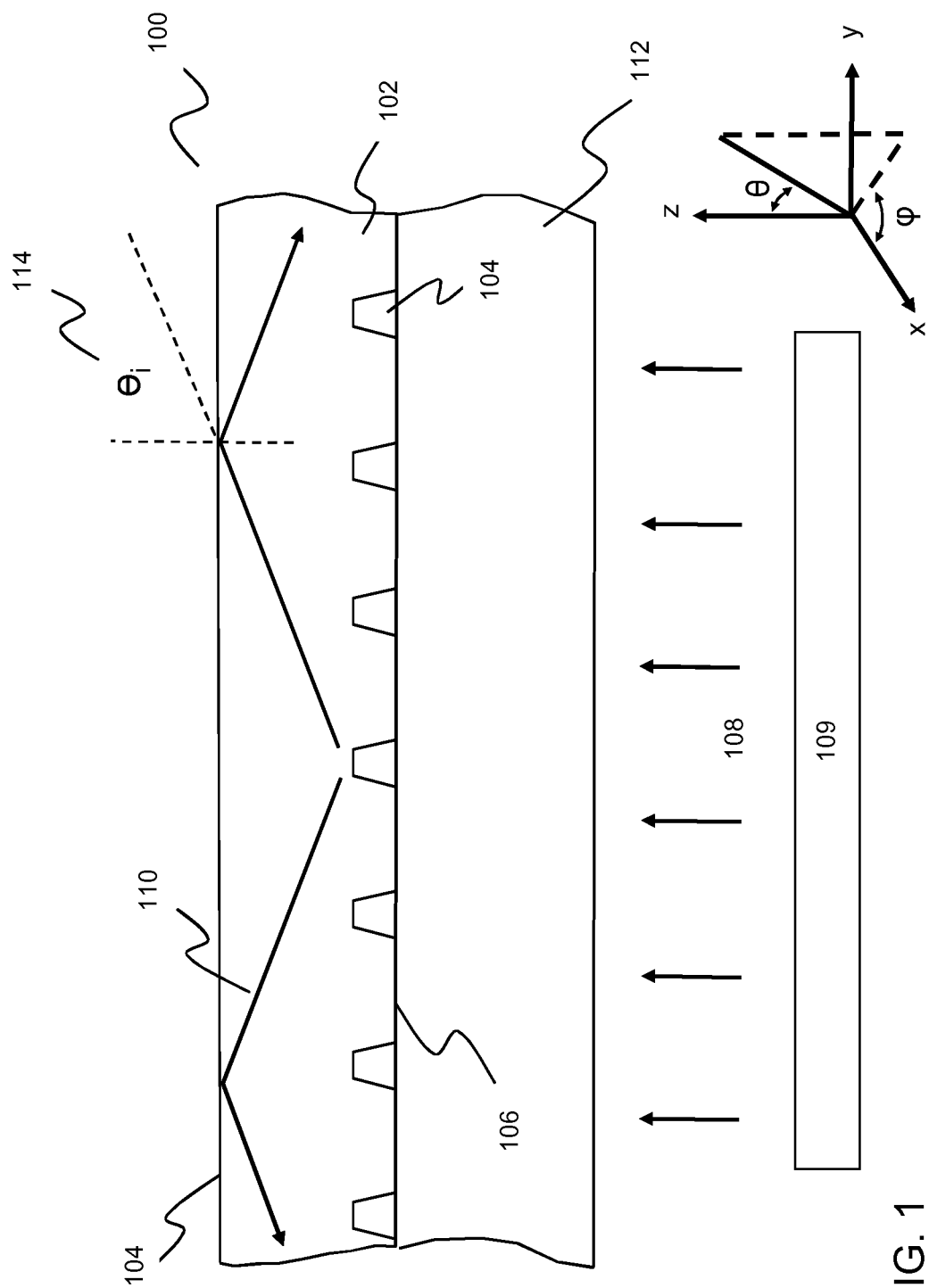
FIG. 1 schematically depicts a luminescent sideward emitting structure according to an embodiment of the invention.

FIG. 1 schematically depicts a luminescent sideward emitting structure according to an embodiment of the invention. The sideward emitting structure 100 may comprise an array of nanoparticles 104 that is in close proximity to the wavelength conversion layer 102. Here, in close proximity means that the distance between the nanoparticles and the wavelength conversion layer is about the order of the wavelength of the incident light or the light emitted by the wavelength conversion layer or less.

The wavelength conversion layer may be configured for receiving light of at least a first wavelength, preferably light in the blue part of the optical spectrum, and converting at least part of said received light into light of at least a second wavelength, preferably light in the red or green part of the optical spectrum. To that end, the wavelength conversion layer may be of a transparent material in which a wavelength converting material is embedded. The wavelength converting material may comprise molecules, ions and/or particles that have the ability to absorb light from at least a first wavelength and to emit light of at least a second wavelength. Typically the wavelength converting material may comprise one or more fluorescent and/or luminescent materials, including phosphors, dyes (e.g. dyes from the Lumogen F series of BASF™ such as Red 305), quantum dots (e.g. CdSe/CdS quantum dots) and/or rare earth ions or combinations thereof that absorb light in the UV or blue part of the electromagnetic spectrum and emit light in parts of the red or green part of the electromagnetic spectrum.

The transparent material of the wavelength conversion layer may be of suitable (optical grade) polymer that is sufficiency transparent and stable for serving as a matrix (host) material for the wavelength converting material. Examples of suitable optically transparent polymers include polystyrenes, polymethyl methacrylates (PMMA) polycarbonates (PC), polyethylene terephthalate (PET), polyethylene naphthalate (PEN) or derivatives thereof. Alternatively and/or in addition, the transparent material may comprise a transparent inorganic material, e.g. a silica glass or hybrid organic/inorganic networks formed by e.g. a sol-gel method or the like. It is submitted that the wavelength conversion layer in FIG. 1 may comprise one or more layers of optical transparent material wherein at least one of the layers comprises a wavelength converting material.

The wavelength conversion layer and the nanoparticle array may be formed on a transparent support substrate 112, e.g. a transparent polymer or glass layer. The wavelength conversion layer comprises a light receiving first surface 106 for receiving light 108 of at least a first wavelength originating from a light source 109 e.g. a solid-state light source comprising one or more light emitting diodes and/or lasers.

The nanoparticle array may comprise nanoparticles that are in close proximity to the wavelength conversion layer. As will be described hereunder in more detail, the nanoparticle array and its optical properties may be characterized by its symmetry (rotational or axial), periodicity, its lattice parameters, particle shape, particle dimensions and/or its dimensions. The nanoparticles may have an asymmetrical shape including (truncated) pyramids, (truncated) cones or cylinders. Typical particle dimensions (width, height, diameter) may range between 20-500 nm. For example, in an embodiment, the nanoparticles may have a shape of a truncated pyramid having a bottom side length in the range of 100 to 300 nm and a top side length in the range of 30 nm to 250 nm. In another embodiment, the nanoparticles may have a shape of a truncated cone having a bottom diameter in the range 100 to 300 nm, a top diameter in the range of 30 to 100 nm and a height in the range of 50 to 400 nm.

The nanoparticles can resonantly enhance the emission of light in the wavelength conversion layer. For example, metallic nanoparticles exhibit plasmon resonances when exposed to light of a wavelength that is of the order of the dimensions of the nanoparticle. Such metal nanoparticles may comprise Ag, Al, Ga, Cu, Au or alloys thereof. Similarly, dielectric nanoparticles exhibit Mie resonances when exposed to light of a wavelength that is of the order of the dimensions of the nanoparticle. Such dielectric nanoparticles may comprise metal oxide nanoparticles (e.g. $Al_2O_3$, $Ta_2O_5$, $Ti_3O_5$, $TiO_2$, $SrTiO_3$, $BaTiO_3$, $ZrO_2$, $Nb_2O_5$, $CeO_2$ and $Si_3N_4$), semiconducting (e.g. Si) or insulating (e.g. $SiO_2$, nano-porous siliconoxide (made by templating methods e.g. low K materials know from the semi-conductor industry)=LOW INDEX) nanoparticles and/or polymer nanoparticles including nanoparticles comprising polymethyl methacrylates (PMMA) polycarbonates (PC), polyethylene terephthalate (PET), polyethylene naphthalate (PEN) or derivatives thereof or silicones or fluoropolymers.

As shown in FIG. 1, the wavelength conversion layer may define a rectangular transparent sheet with a top surface and bottom surface that is parallel to the x,y plane. Effectively, the wavelength conversion layer defines a light guide structure in which light can travel by internal reflection. The direction of the light that is emitted by the wavelength conversion material can be described on the basis of terms of spherical coordinates including an inclination angle $\theta_i$ and an azimuthal angle φ, wherein the inclination angle is defined with respect to the z-axis (the axis normal to the (top) surface of the wavelength conversion layer) and wherein the azimuthal angle φ is defined with respect to the x or y axis. Light in the wavelength conversion layer that is emitted towards the (top) surface under an inclination angle $\theta_i$ 114 that is equal to or larger than the critical angle will travel through the wavelength conversion layer by total internal reflection.

Figures 2A, 2B:
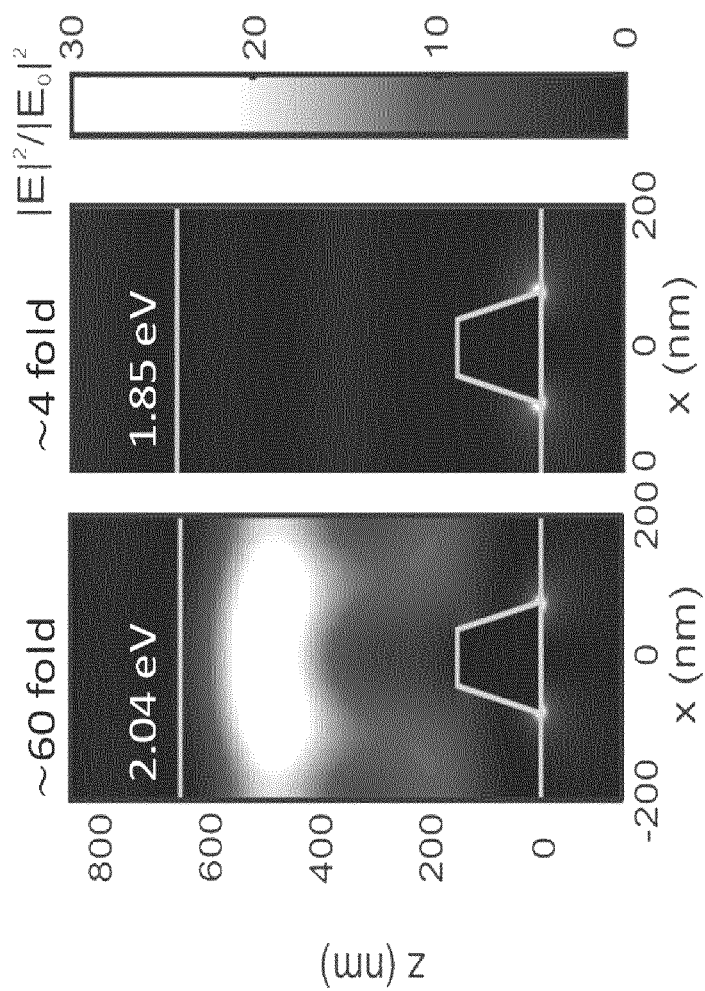
FIG. 2A and 2B depict the field intensity enhancement in a wavelength conversion layer that is in contact with a plasmonic array of nanoparticles.

FIG. 2A and 2B show plots of the local intensity enhancement of the field around an individual metallic nanoparticle on a substrate that is covered with a polymer layer in which a luminescent dye is embedded. In this example, a square array (lattice period 400 nm) of slightly tapered cylindrical aluminum nanoparticles (140 nm diameter and 150 nm height) is used. The nanoparticles are formed on a fused silica substrate with refractive index 1.46 and covered with a 650 nm thick polystyrene layer with refractive index 1.59. The polystyrene layer contains dye molecules (Lumongen F RED 305 BASF) at a concentration of 2 wt-%. Such nanoparticle arrays can be easily fabricated on the basis of e.g. an (nano)imprint technology. FIG. 2A depicts the spatial distribution of the field intensity at a frequency of 1.85 eV wherein the resonant behavior can be attributed to localized surface plasmon resonances of the individual nanoparticle. The resonances may lead to a four-fold increase the field intensity at the particle site (i.e. certain areas close to the metal/dielectric interface of the nanoparticle). These localized surface plasmon resonances may induce resonant modes in the wavelength conversion layer that exhibit areas of high-field intensities extending over a large area in the wavelength conversion layer above the particles. The areas of high field intensity may cause enhanced emission of the dye.

One type of resonant mode relates to diffractive coupling of the localized surface plasmon resonance of individual nanoparticles causing collective photonic resonances that are known as surface-lattice resonances (SLRs). Another type of collective resonant modes relates to diffractive coupling of the localized surface to waveguide modes of the wavelength conversion layer. An example of such resonant mode is shown in FIG. 2B depicting the spatial distribution of the field intensity at a frequency of 2.04 eV. The area of a field enhancement of around 60 extends over a large area in the wavelength conversion layer above the nanoparticles. Similar effects can be obtained on the basis of dielectric nanoparticles exhibiting localized Mie resonances.

It has been surprisingly found that the nanoparticle array in FIG. 1 can be configured such that the light emitted by the wavelength conversion material can be resonantly enhanced in sideward directions, i.e. in directions that have a large inclination angle $\theta_i$ when compared to directions that have a relatively small inclination angle. More generally, it has been surprisingly found that the nanoparticle array in close proximity to the wavelength conversion layer may form a sideward emitting luminescent structure wherein the luminous intensity of the structure in one or more directions of a large inclination angle $\theta_i$ is larger than the luminous intensity in directions with a small inclination angle. Here, the term large inclination angle includes inclination angles that are equal to or larger than the critical angle of the dielectric interface of the wavelength conversion layer with its surroundings, whereas the term small inclination angle includes inclination angles that are substantially smaller than the critical angle. The term sideward emitting luminescent structures includes luminescent structures that have radiation patterns that are known in the field as batwing radiation patterns and side-emitting radiation patterns.

As will be shown hereunder in more detail, emitted light with a large inclination angles, in particular inclination angles equal to or larger than the critical angle of the wavelength conversion layer, may be achieved by controlling the parameters of the nanoparticle array (the symmetry, lattice period, particle shape, particle material) and/or the wavelength conversion layer (material, dimensions).

Figures 3A, 3B:
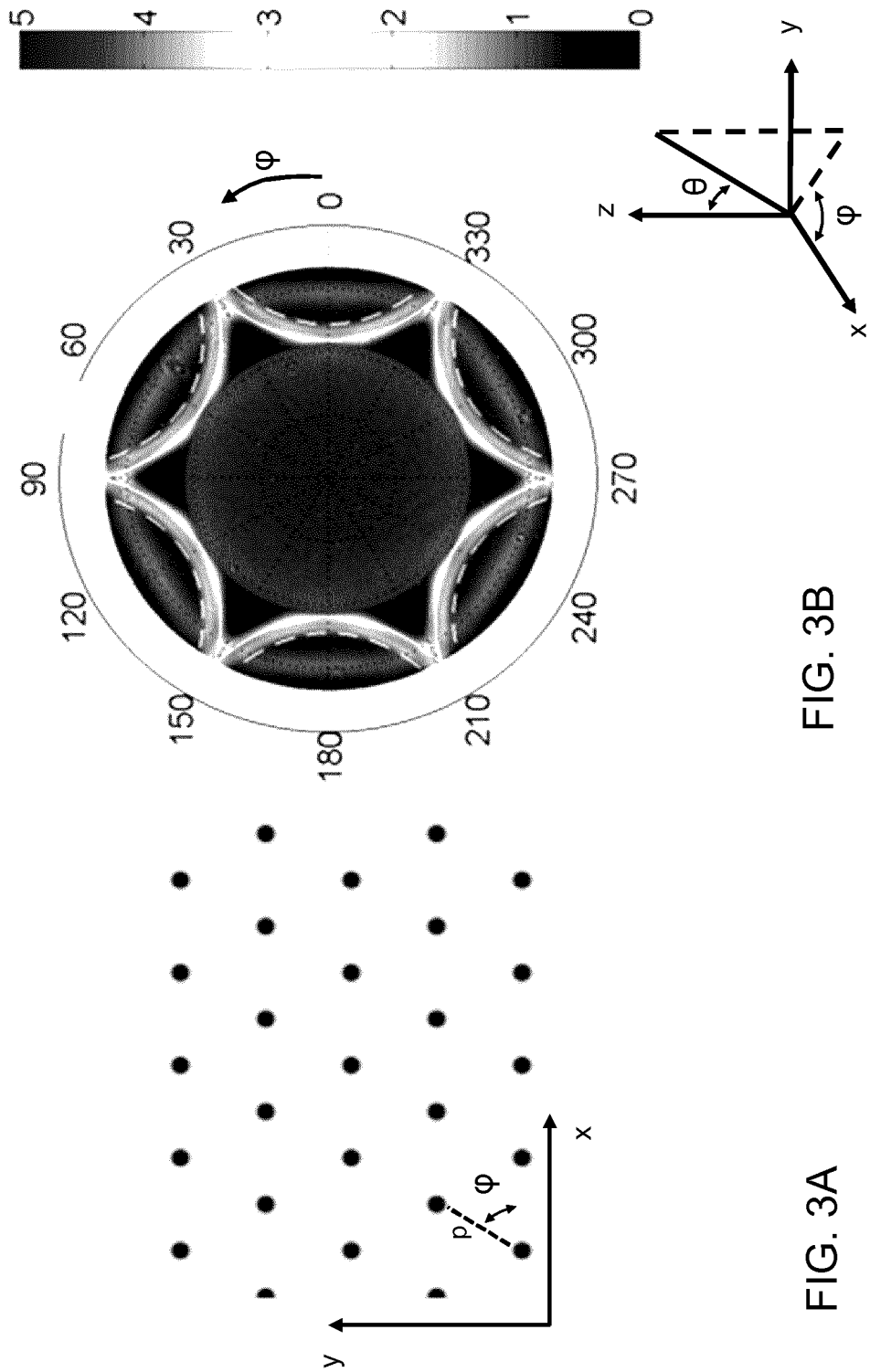
FIG. 3A-3C depict experimental results of a sideward emitting structure according to an embodiment.
Figure 3C:
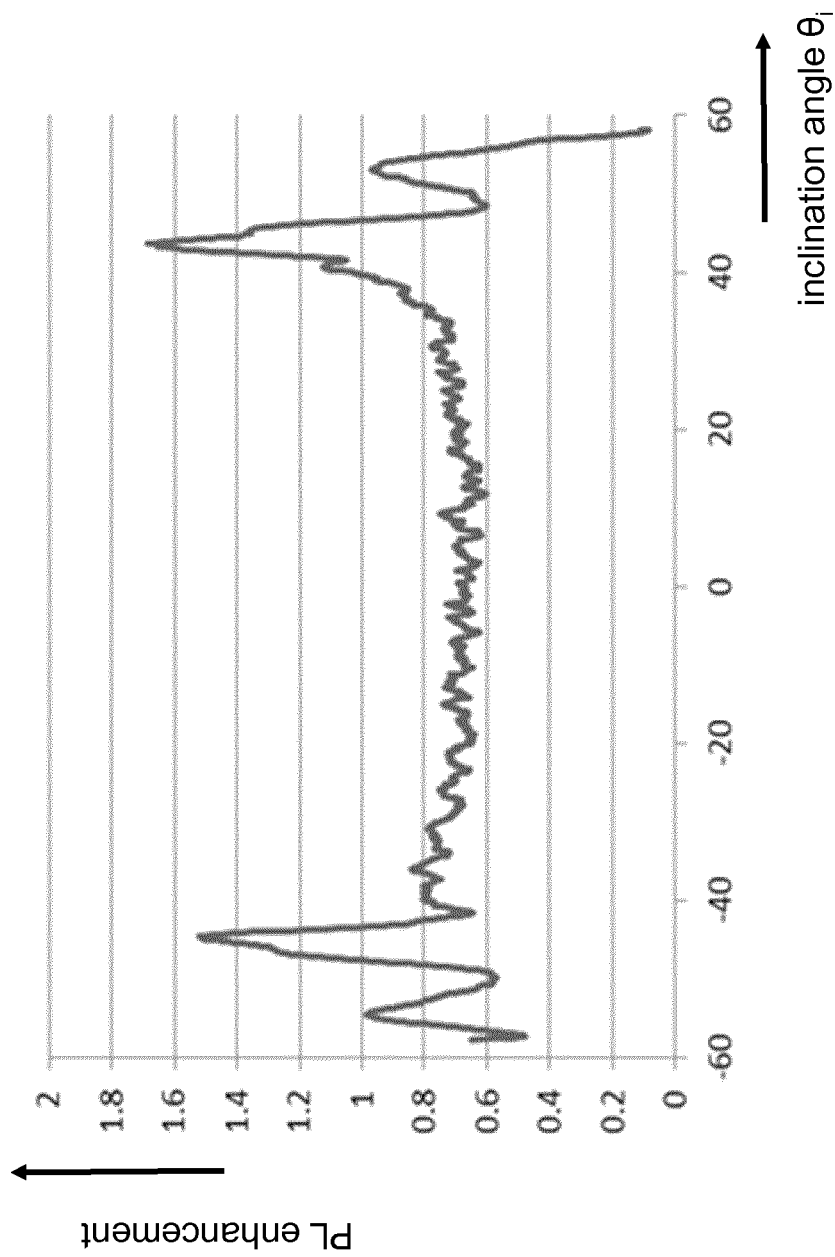

FIG. 3A-3C show experimental results of a sideward emitting structure according to an embodiment. In particular, FIG. 3B and 3C show experimental measurements of a sideward emitting structure wherein the nanoparticle array has a hexagonal configuration as shown in FIG. 3A. The array defines a hexagonal lattice of nanoparticles (in this example metal nanoparticles made out of aluminum). The lattice has a lattice period, which in this example is selected to be p=275 nm. A lattice distance Λ(φ) may defined as the lattice vector at azimuthal angle φ. Hence, in this particular case, different lattice distances may be defined in the azimuthal directions φ=0°, 30°, 60° and 90° of the hexagonal lattice.

The nanoparticles were fabricated on a fused silica substrate (n=1.46) and covered with wavelength conversion layer made of a 700 nm thick polystyrene layer (n=1.58) comprising the wavelength conversion material, in this example is the organic luminescent dye F305 that emits red light at a wavelength of 620 nm. The aluminum particles have a truncated conical shape with a height of 150 nm, a 140 nm bottom diameter and 80 nm top diameter.

The angle-dependent emission is measured by a Fourier microscope using a filter at 620 (±10) nm and immersion oil with refractive index 1.52. The results are shown in FIG. 3B and 3C. FIG. 3B represents a graph of the angular dependence of the photoluminescence of the nanoparticle array. The graph shows that—depending on the azimuthal angle φ—the inclination angle of the light that is resonantly enhanced in a particular direction varies between 41°<θ<90° (i.e. a range of inclination angles equal to or larger than the critical angle θc of the light guide, which in this particular example is approximately 41°). FIG. 3C depicts a cross-section of the graph in FIG. 3B for an azimuthal angle φ of zero degree. This figure shows the photoluminescence exhibits enhanced light emission at an inclination angle of approximately 42°. Increasing the azimuthal angle φ will cause the peaks in FIG. 3C to shift within the range of 41°<$\theta_i$<90° as shown FIG. 3B.

FIG. 3B further illustrates that the symmetry of nanoparticle array has a direct effect on the symmetry of the emission pattern. Hence, an array with a high degree of symmetry (including for example rotational, reflectional, translational, helical, scale and/or fractal symmetry) can be used in order to generate a more symmetrical emission pattern. Advantageous nanoparticle array patterns may comprise special symmetrical patterns such as the bulls-eye pattern or the sunflower pattern or a Penrose lattice.

Figures 4A, 4B:
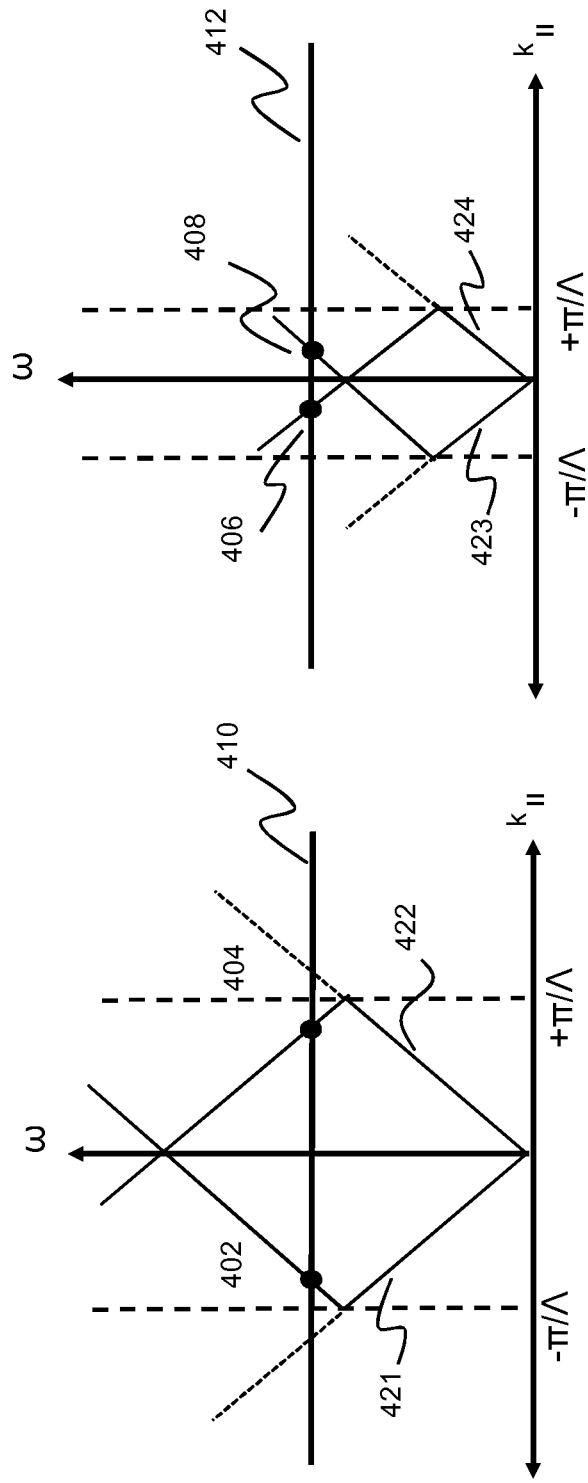
FIG. 4A and 4B show schematic diagrams illustrating the relation between the inclination angle of resonantly emitted light of a particular frequency and the lattice period in reciprocal space.

The influence of the inclination angle of the emitted light by the lattice period of the nanoparticle array is further shown in FIG. 4A and 4B. These figures depict schematic diagrams of frequency ω=hc/λ as a function of the parallel wave vector $k_{//}=2\pi/\lambda \sin \theta_i$. The diagrams illustrate the relation between the inclination angle $\theta_i$ of resonantly emitted light of a particular frequency $\omega=hc/\lambda$ and the lattice period p, wherein $\lambda$ is the wavelength of emitted light. For a surface-lattice mode, the angle of highest emission intensity can be estimated from the Rayleigh condition:

$$\lambda/\Lambda=|\pm n_1 \sin\theta_i \pm n_2| \quad (1)$$

where $\Lambda$ is the lattice distance associated with a lattice vector of length p and azimuthal angle $\varphi$, $n_1$ is the refractive index of the medium into which emission takes place (e.g. the light guide or in case no light guide is used air) and $n_2$ is the refractive index of the medium for the surface-lattice (Rayleigh) mode (e.g. the wavelength conversion layer).

Equation (1) yields that for inclination angles larger than the critical angle $\theta c=\mathrm{asin}(1/n_1)$ for total reflection (i.e. $\theta c<\theta<90°$) the lattice distance $\Lambda(\varphi)$ in a certain azimuthal direction should be in the range of:

$$\lambda/(n_1+n_2)<\Lambda<\lambda/(1+n_2) \quad (2)$$

Condition (2) may be applied to arrays of various symmetries. For example, a hexagonal lattice structure comprising a lattice period p as depicted in FIG. 3A may be selected. In that case, the relevant (minimum and maximum) lattice distances $\Lambda(\varphi)$ may be defined as $\Lambda_1=\frac{1}{2}p\sqrt{3}$ (along $\varphi=0°$ and 60°) and $\Lambda_2=\frac{3}{4}p$ (along $\varphi=30°$ and 90°), where p is the lattice period and $\varphi$ the azimuthal angle. On the basis of these lattice distances, condition (2) implies that the optimum lattice period p for all azimuthal angles should be in the range 4/3 $\lambda/(n_1+n_2)<p<2/\sqrt{3}\ \lambda/(1+n_2)$.

When using $n_1=n_2=1.52$ (e.g. PMMA or glass or the like) condition (2) implies for a certain wavelength of interest $\lambda$ that the lattice period should be within a predetermined range. For example, when selecting $\lambda=620$ nm (the wavelength of light that is emitted by a red phosphor) the lattice period p should be within the range of $272<p<284$ nm. Similarly, for green light of $\lambda=530$ nm that is emitted by a green phosphor the lattice period p should be within the range of: $232<p<243$ nm.

FIG. 4A and 4B provide a graphical representation of the resonant conditions of the emitted radiation. These resonant conditions are determined by the intersection points 402, 404,406,408 of the emission frequency of interest 410,412 and the dispersions curves 421, 422, 423, 424 of the surface lattice resonance modes and/or the waveguide modes. Here, diagram of FIG. 4A applies to situation wherein the lattice period is relatively small compared to the emitted wavelength and the diagram of FIG. 4B applies to situations wherein the lattice period is relatively large compared to the emitted wavelength.

As already described above, local resonances of the individual nanoparticles (e.g. plasmon resonances or Mie resonances) may also collectively couple to waveguide modes of the wavelength conversion layer that may exist in cases the refractive index of the wavelength conversion layer is higher than the refractive index of the medium surrounding it.

Further, for diffractive coupling of local resonances to a waveguide mode, similar diagrams than those depicted in FIG. 4A and 4B may be used to determine the relation between the inclination angle $\theta_i$ of resonantly emitted light of a particular frequency $\omega=hc/\lambda$ and the lattice period p. In general, the waveguide mode is always) in between the Rayleigh modes for the contained media (the wavelength conversion layer. The waveguide modes of the wavelength conversion layer may be controlled by applying a low refractive index layer over the wavelength conversion layer and the dimensions—in particular the thickness—of the wavelength conversion layer.

Hence, the thickness of the wavelength conversion layer may be optimized such that the photoluminescence is maximally enhanced by collective coupling of localized resonances to waveguide modes at a certain desired frequency (typically the wavelength of the light emitted by the wavelength converting material in the wavelength converting layer).

Figure 5:
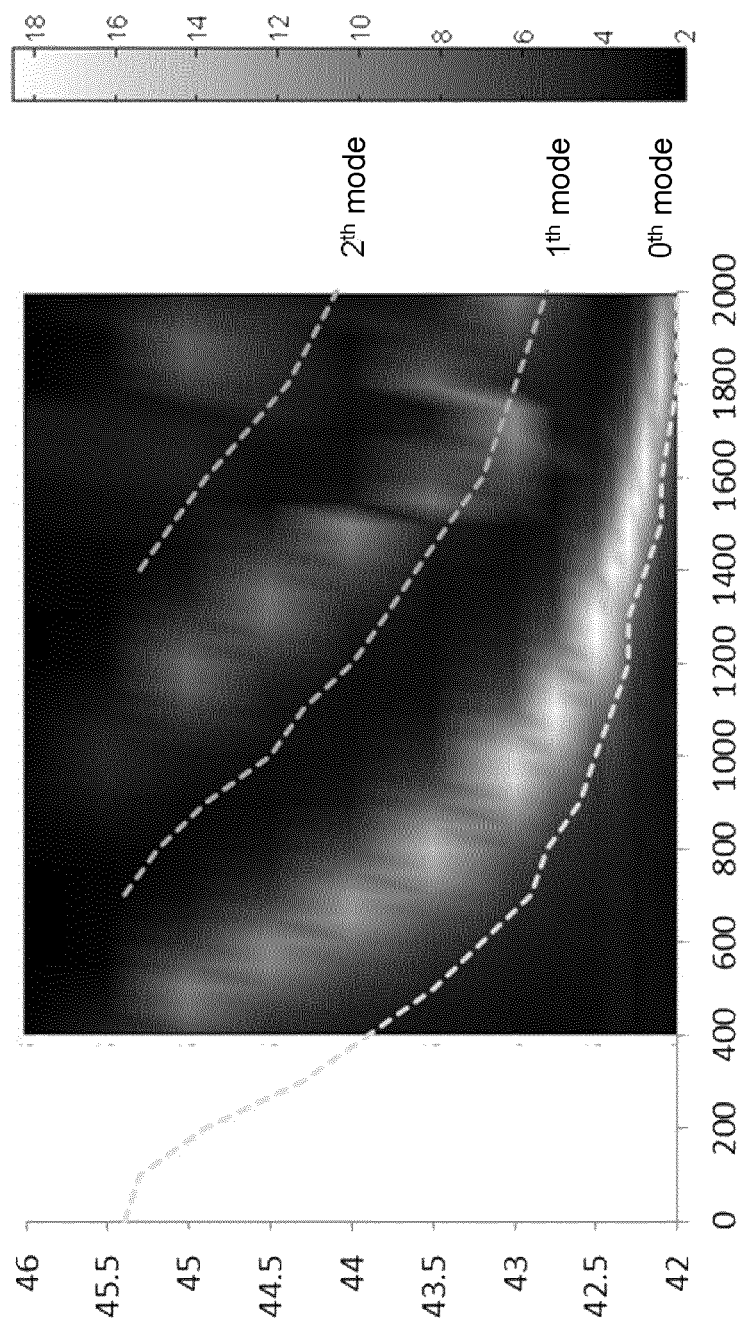
FIG. 5 depicts the photoluminescence enhancement as a function of the layer thickness of the wavelength conversion layer and inclination angle of the emitted light.

FIG. 5 depicts the photoluminescence enhancement for p-polarized light as a function of the layer thickness of the wavelength conversion layer and inclination angles of the emitted light for a plasmonic structure as described with reference FIG. 4A-4C (i.e. a hexagonal array with period p=275 nm and an photoluminescence intensity at 620 nm). The calculated positions for the waveguide modes of order 0, 1, 2 and 3 (and diffraction order 1) are also illustrated in FIG. 5. Here, the inclination angle is examined just above the critical angle of 41° for an azimuth 0°.

As shown in FIG. 5, the resonant behavior is due to first-order diffraction into the waveguide modes in the (high-index) layer between the metal particles and the (relatively low-index) top medium. These layers can support guided modes (for wavelength 620 nm, refractive index 1.58 and the indicated inclination angles). The calculated enhancement of the field intensity is shown in FIG. 5. Also the calculated positions for the various waveguide modes are indicated in FIG. 5. These positions are shifted with respect to the thickness showing maximal enhancement by the metal particle thickness of 150 nm. FIG. 5 further shows that the zero-th waveguide order supports the strongest modes for thicknesses between 500 and 2000, preferably between 1300 and 1900 nm. These modes become stronger with increasing thickness up to a thickness of approximately 1500 nm, after which it decreases again. The increase is due to the well-known behavior of the confinement factor (i.e. the fraction of electromagnetic energy that is in the central high-index layer), which increases with thickness. For very large thickness, the overlap with the metal particles is so small that there is hardly any coupling between the particles and the waveguide mode. For that reason the enhancement diminishes above 1500 nm. Hence, on the basis of the results in FIG. 5 it follows that the thickness of the wavelength conversion layer is selected between 400 and 4000 nm, preferably between 1300 and 1900 nm.

Figure 6:
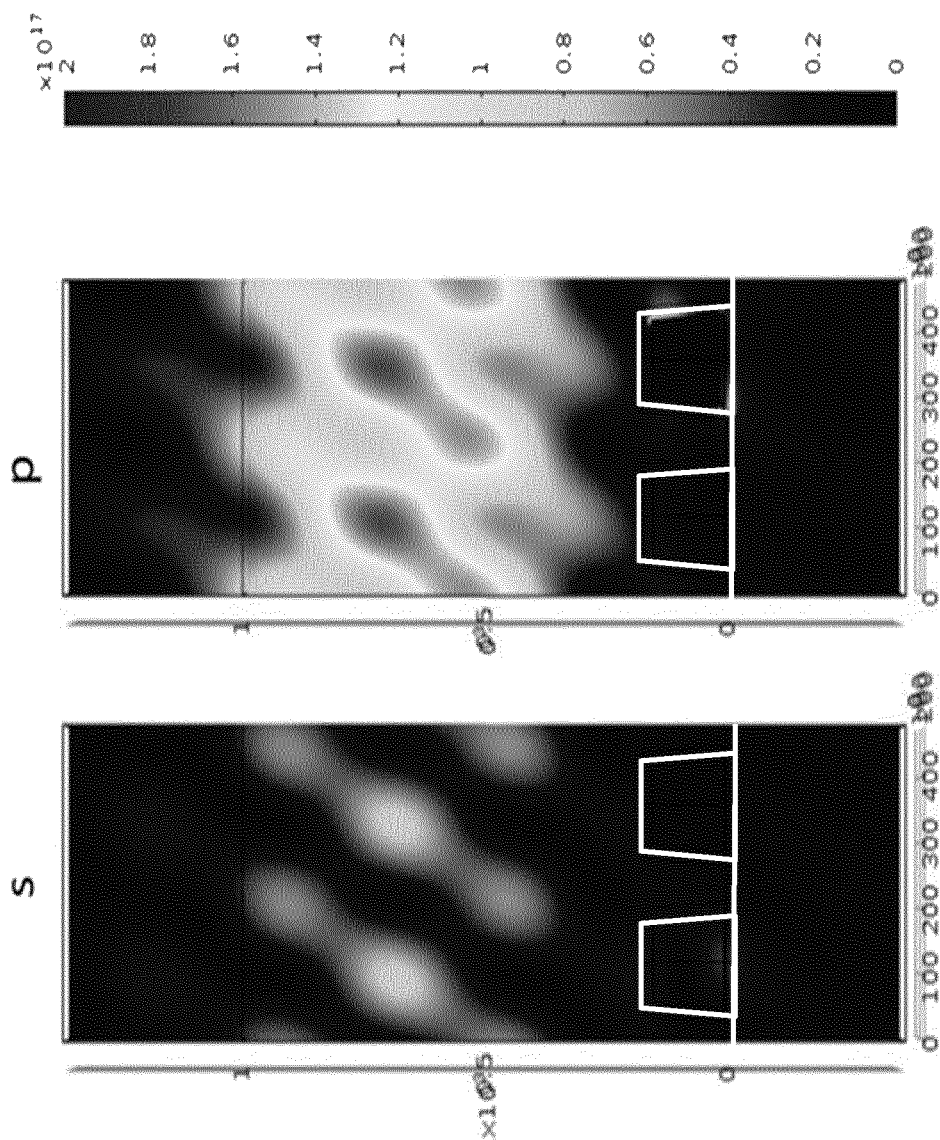
FIG. 6 depicts the spatial distribution of the field intensity of light in a cross section of a luminescent sideward emitting structure according to an embodiment of the invention.

FIG. 6 depicts the spatial distribution of the field intensity of s- and p-polarized light with wavelength 620 nm in a cross section a luminescent sideward emitting structure that is similar to the one described with reference to FIG. 4A-4C, with the exception that the thickness of the wavelength conversion layer thickness is 1000 nm and the emitted light has an inclination angle of 43°. These figures show areas of enhanced field intensities in the wavelength conversion layer due to coupling of local plasmon resonances to the waveguide-mode mode.

The above-described effects also hold for arrays of low-index dielectric nanoparticles, e.g. low-refractive inorganic dielectric nanoparticles such as nanoparticles of [materials] and/or low-refractive organic dielectric nanoparticles such as metal oxide nanoparticles (e.g. Al2O3, Ta2O5, Ti3O5, TiO2, SrTiO3, BaTiO3, ZrO2, Nb2O5, CeO2 and Si3N4, semiconducting (e.g. Si) or insulating (e.g. SiO2) nanoparticles and/or polymer nanoparticles, e.g. polymethyl methacrylates (PMMA) polycarbonates (PC), polyethylene terephthalate (PET), polyethylene naphthalate (PEN) or derivatives thereof or silicones or fluoropolymers. The advantage of dielectric nanoparticles is that they do not absorb the light, at least less strongly than metals.

FIG. 7A and 7B depict illumination devices according various embodiments of the invention. In these embodiments, the illumination devices comprise a sideward emitting structure that is coupled to a planar light guide according to various embodiments of the invention.

FIG. 7A illustrates an illumination device wherein a sideward emitting structure 702 is exposed to light of a first wavelength 704 originating from a light source (not shown) and generates light of a second wavelength 705 that is efficiently injected under a large inclination angle θ into a light guide medium 706. Such light injection is particular advantageous in thin-layer light emitting devices such as light tiles or flexible light-emitting foils. As the injected light should stay inside the light guide medium, the nanoparticle array is configured such that a substantial part of the emitted light has an inclination angle equal to or larger than the critical angle $\theta c = a\sin(1/n_1)$ for total reflection, i.e. $\theta c < \theta < 90°$ so that the light can be internally transported via total internal reflection to one or more emitting areas of the light guide. Efficient light injection into the light guide can be achieved by controlling the lattice period and symmetry of the nanoparticle array such that the inclination angle of the resonantly enhanced light is larger than the critical angle. In some embodiments, e.g. in case of light tiles or light-emitting foils, the emitting areas of the light guide may be arranged at the top or bottom face 708,710 of the light guide. The emitting areas may comprise light extraction structures (not shown) for coupling light out of said light guide. In other embodiment, part of a side face 712 of the light guide may be configured as an emitting area.

FIG. 7B illustrates an illumination device wherein a sideward emitting structure 702 is used for efficiently injecting light into a light guide medium 706 in a similar way as described with reference to FIG. 7A. In this particular embodiment however, a low-index layer 707 between the sideward emitting structure and the light guide (or substrate) is used in order to optically couple the sideward emitting structure with the light guide. The low-index layer provides strong wave-guide modes, which would disappear when the emissive layer would be brought in contact with a matching index of e.g. a glue or glass of the light guide. By selecting a material with a refractive index between air and the refractive index of the light guide, both waveguide modes and coupling under the critical angle are still possible. For instance, if both the emissive layer and the light diode have n=1.52, a low-index layer with n=1.43 would allow radiation with inclination angles up to 70° to escape. Examples of low-index materials include $MgF_2$, nano-porous silica and silicon oxide.

Figure 8:
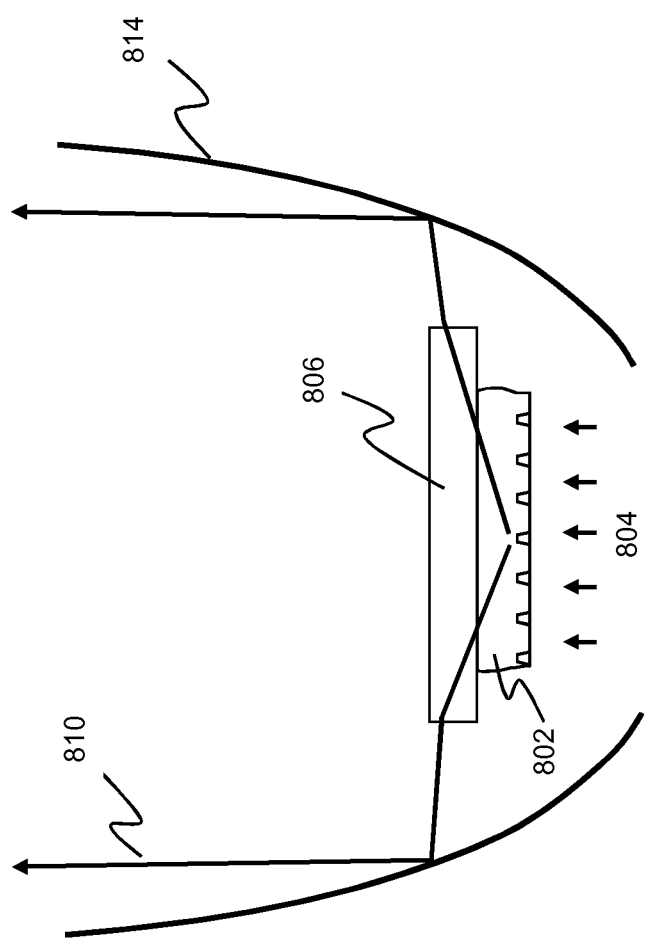
FIG. 8 depicts an illumination device according to another embodiment of the invention.

FIG. 8 depicts an illumination device according to another embodiment of the invention. In particular, FIG. 8 depicts an illumination device wherein a sideward emitting structure 802 is exposed to light of a first wavelength 804 originating from a light source (not shown) and generates light of a second wavelength 810. The sideward emitting structure generates a radiation pattern that comprises field intensities in one or more directions of large inclination angle $\theta_i$ that are larger than field intensities in one or more directions of small inclination angle. Optionally, the sideward emitting layer may be optically coupled to one or more light guiding members 806. A reflective angle-to-area converter 814 such as a compound parabolic concentrator (CPC) may be used for converting at least part of the sideward emitting light of the illumination structure into a high-brightness collimated light beam.

Figure 9:
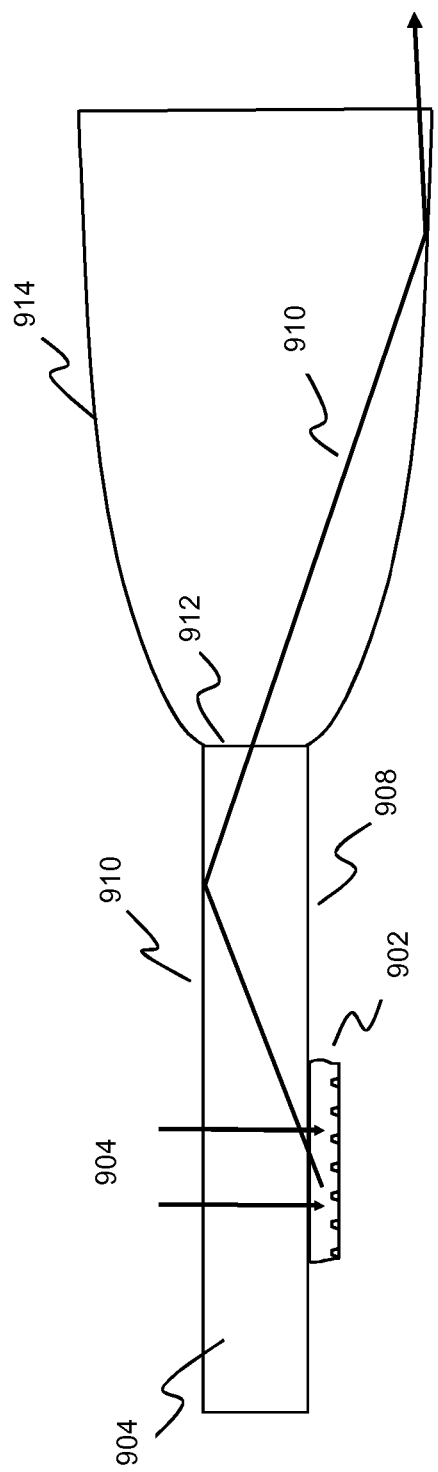
FIG. 9 depicts an illumination device according to yet another embodiment of the invention.

FIG. 9 depicts an illumination device according to yet another embodiment of the invention. In particular, FIG. 9 depicts a sideward emitting structure 902 that is configured for injecting light in a light guide member 906 in a similar way as the illumination devices of FIG. 7A and 7B. The light guide member may have a top and a bottom surface 908,910 and one or more side faces 912. An angle-to-area converter 914 of a transparent material, e.g. a compound parabolic concentrator made of glass or a transparent polymer, may be optically coupled (e.g. glued) to part of one of the side faces of the light guide in order to extract light out of the wave guide. In this particular embodiment, the angle to area conversion of the light 910 in the angle-to-area converter is achieved by total internal reflection by the light at the air interface of the angle-to-area converter.

In contrast to conventional solid-state luminescent light sources that require inefficient and bulky secondary optics comprising a combination of reflective and diffractive optical elements, the luminescent sideward emitting structure enables the realization of illumination devices that only need one or more reflective elements for the realization of directional light beams. This is particular advantageous in case of high-brightness directional light sources (e.g. for projection), automotive headlights spot lights, etc.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. Illumination structure comprising:
a wavelength conversion layer configured for receiving light of at least a first wavelength and converting said received light into light of at least a second wavelength;
an array of nanoparticles arranged in a plane in contact with or in close proximity to said wavelength conversion layer, at least part of said array forming a lattice characterized by at least one lattice period p, wherein said lattice period is selected such that in operation:
resonances of at least part of said nanoparticles are diffractively coupled into one or more collective resonant modes at said second wavelength in said wavelength conversion layer; and,
a sideward emitting radiation pattern is generated by said illumination structure, wherein said radiation pattern comprises field intensities in one or more directions of large inclination angle $\theta_i$ with respect to said array plane that are larger than field intensities in one or more directions of small inclination angle.

2. Illumination structure according to claim 1, wherein said one or more collective resonant modes comprise one or more surface-lattice resonant modes associated with said nanoparticle array, said at least one lattice period being selected such that at least one of said one or more surface lattice resonant modes is resonant with said light of said second wavelength.

3. Illumination structure according to claim 1, wherein said one or more collective resonant modes comprise one or more waveguide modes associated with said wavelength conversion layer, said at least one lattice period being selected such that at least one of said one or more waveguide modes is resonant with said light of said second wavelength.

4. Illumination structure according to claim 3, wherein at least part of said wavelength conversion layer is in contact with a low-index layer for providing strong waveguide modes in said wavelength conversion layer, the refractive index of said low-index layer being smaller than the refractive index of said wavelength conversion layer.

5. Illumination structure according to claim 3, wherein the thickness of said wavelength conversion layer is selected such that said field intensities in one or more directions of large inclination angle $\theta_i$ are enhanced by said at least one of said one or more waveguide modes that is resonant with said light of said second wavelength.

6. Illumination structure according to claim 1, wherein said least one lattice period is selected such that if said wavelength conversion layer is in contact with a light guide at least part of said one or more directions of large inclination angle $\theta_i$ are larger than the critical angle for total reflection in said light guide.

7. Illumination structure according to claim 6, wherein said least one lattice period is selected such that:

$$\lambda/(n_1+n_2)<\Lambda<\lambda/(1+n_2)$$

wherein the lattice distance $\Lambda(\varphi)$ is defined as the lattice vector at azimuthal angle $\varphi$, $n_1$ is the refractive index of said wavelength conversion layer, $n_2$ is the refractive index of said light guide layer and $\lambda$ is the wavelength of the light of said second wavelength.

8. Illumination structure according to claim 1, wherein said lattice is arranged to have one or more symmetries, preferably said one or more symmetries including a rotational, reflectional, translational, helical, scale and/or fractal symmetry; and/or, wherein said lattice is formed by aperiodic tiling, preferably said aperiodic tiling forming a Penrose lattice.

9. Illumination structure according to claim 1, wherein at least apart of said nanoparticles are metallic nanoparticles or dielectric nanoparticles.

10. Illumination structure according to claim 1, wherein at least part of said nanoparticles have a shape of a (truncated) pyramid or a (truncated) cone, preferably said truncated pyramid having a bottom side length in the range of 100 to 300 nm and a top side length in the range of 30 nm to 250 nm and said truncated cone having a bottom diameter in the range 100 to 300 nm, a top diameter in the range of 30 to 250 nm and a height in the range of 50 to 400 nm.

11. Illumination structure according to claim 1, wherein the thickness of the wavelength conversion layer is selected between 400 and 4000 nm, preferably between 1300 and 1900 nm.

12. Illumination device comprising:
at least one light source configured to emit light of at least a first wavelength; and,
one or more illumination structures according to claim 1.

13. Illumination device according to claim 12, further comprising:
a light guide optically coupled to said illumination structure such that at least part of the light with large inclination angle is injected in said light guide, preferably an optical coupling layer being arranged between said light guide and said illumination structure wherein the refractive index of said coupling layer is selected between the refractive index of said light guide and the refractive index of air.

14. Illumination device according to claim 12, further comprising:
one or more reflective members for converting at least part of the sideward emitting light of the illumination structure into a substantially collimated light beam, preferably said one or more reflective members forming an angle-to-area converter, more preferably said one or more reflective members forming a compound parabolic concentrator or an equivalent thereof.

15. Illumination device according to claim 13, wherein at least part of said light guide is configured as a transparent sheet comprising a top surface, a bottom surface and one or more side faces, wherein said top and/or bottom surface comprises one or more light extraction structures for coupling light out of said light guide; or, wherein at least a part of said one of said side faces is coupled to at least one light extraction structure that is configured as an angle-to-area converter of a transparent material, preferably the angle-to-area conversion in said being achieved by total internal reflection.

* * * * *